US010566171B2

United States Patent
Yuan et al.

(10) Patent No.: US 10,566,171 B2
(45) Date of Patent: Feb. 18, 2020

(54) THREE-DIMENSIONAL LAYER-BY-LAYER SHAPING APPARATUS, THREE-DIMENSIONAL LAYER-BY-LAYER SHAPING APPARATUS CONTROL METHOD, AND THREE-DIMENSIONAL LAYER-BY-LAYER SHAPING APPARATUS CONTROL PROGRAM

(71) Applicant: TECHNOLOGY RESEARCH ASSOCIATION FOR FUTURE ADDITIVE MANUFACTURING, Tokyo (JP)

(72) Inventors: Zhixiong Yuan, Tokyo (JP); Kazuya Goto, Tokyo (JP); Toshiyuki Morimura, Tokyo (JP); Takahiro Shimbo, Tokyo (JP)

(73) Assignee: TECHNOLOGY RESEARCH ASSOCIATION FOR FUTURE ADDITIVE MANUFACTURING, Tokyo (JP)

( * ) Notice: Subject to any disclaimer, the term of this patent is extended or adjusted under 35 U.S.C. 154(b) by 379 days.

(21) Appl. No.: 15/123,350

(22) PCT Filed: Mar. 25, 2016

(86) PCT No.: PCT/JP2016/059643
§ 371 (c)(1),
(2) Date: Sep. 2, 2016

(87) PCT Pub. No.: WO2017/163403
PCT Pub. Date: Sep. 28, 2017

(65) Prior Publication Data
US 2018/0166251 A1 Jun. 14, 2018

(51) Int. Cl.
*H01J 37/147* (2006.01)
*B23K 15/00* (2006.01)
(Continued)

(52) U.S. Cl.
CPC ........ *H01J 37/1474* (2013.01); *B22F 3/1055* (2013.01); *B23K 15/002* (2013.01);
(Continued)

(58) Field of Classification Search
CPC .......................... B22F 3/105; B23K 15/0086
(Continued)

(56) References Cited

U.S. PATENT DOCUMENTS

2004/0026807 A1* 2/2004 Andersson .............. B22F 3/004
264/40.1
2013/0300286 A1 11/2013 Ljungblad et al.
(Continued)

FOREIGN PATENT DOCUMENTS

DE 10 2013 017 792 A1 4/2015
EP 1 296 788 B1 1/2005
(Continued)

OTHER PUBLICATIONS

International Search Report (ISR) dated Jun. 28, 2016 for International Application No. PCT/JP2016/059643.
(Continued)

*Primary Examiner* — Lorne E Meade
*Assistant Examiner* — Michael S. Poetzinger
(74) *Attorney, Agent, or Firm* — Ladas & Parry LLP (57) ABSTRACT

This invention can maintain the temperature of the shaping plane in a three-dimensional layer-by-layer shaping apparatus. A three-dimensional layer-by-layer shaping apparatus includes a material spreader that spreads the material or materials of a three-dimensional layer-by-layer shaped object onto the shaping plane on which the three-dimensional layer-by-layer shaped object is to be shaped; an electron gun that generates an electron beam; at least one deflector that deflects the electron beam so that it scans the shaping plane one- or two-dimensionally; at least one lens
(Continued)

that is positioned between the electron gun and the deflector, and focuses the electron beam; a focus controller that controls the focus of the electron beam based on which region is to be scanned by the electron beam; and a controller that controls the deflecting direction of the deflector and the scanning rate.

8 Claims, 6 Drawing Sheets (51) Int. Cl.
| | | |
|---|---|---|
| H01J 37/302 | (2006.01) | |
| B33Y 30/00 | (2015.01) | |
| B22F 3/105 | (2006.01) | |
| H01J 37/21 | (2006.01) | |
| B33Y 10/00 | (2015.01) | |
| B33Y 50/02 | (2015.01) | |
| B29C 64/153 | (2017.01) | |
| B29C 64/393 | (2017.01) | |
| B29C 64/268 | (2017.01) | |
| B29C 64/205 | (2017.01) | |
| B23K 15/02 | (2006.01) | |
| H01J 37/10 | (2006.01) | |
| H01J 37/305 | (2006.01) | |
| G21K 1/08 | (2006.01) | |
| B29C 64/10 | (2017.01) | |
| B29C 64/20 | (2017.01) | |

(52) U.S. Cl.
CPC ...... *B23K 15/0013* (2013.01); *B23K 15/0033* (2013.01); *B23K 15/0086* (2013.01); *B23K 15/02* (2013.01); *B29C 64/153* (2017.08); *B29C 64/205* (2017.08); *B29C 64/268* (2017.08); *B29C 64/393* (2017.08); *B33Y 10/00* (2014.12); *B33Y 30/00* (2014.12); *B33Y 50/02* (2014.12); *H01J 37/10* (2013.01); *H01J 37/21* (2013.01); *H01J 37/305* (2013.01); *H01J 37/3023* (2013.01); *B22F 2003/1056* (2013.01); *B22F 2003/1057* (2013.01); *B22F 2999/00* (2013.01); *B29C 64/10* (2017.08); *B29C 64/20* (2017.08); *G21K 1/08* (2013.01); *H01J 2237/30472* (2013.01); *H01J 2237/30483* (2013.01); *H01J 2237/3128* (2013.01); *Y02P 10/295* (2015.11)

(58) Field of Classification Search
USPC .............. 264/497, 112, 125; 219/76, 121.26, 219/121.27, 121.63–121.66, 121.13, 219/121.14, 121.16, 121.17; 250/396 R
See application file for complete search history.

(56) References Cited

U.S. PATENT DOCUMENTS

| | | | |
|---|---|---|---|
| 2014/0370323 A1 | 12/2014 | Ackelid | |
| 2015/0174695 A1* | 6/2015 | Elfstroem | B23K 15/0086 219/121.14 |
| 2015/0273622 A1* | 10/2015 | Manabe | B23K 15/0086 219/76.1 |
| 2015/0283613 A1 | 10/2015 | Backlund et al. | |
| 2016/0271884 A1 | 9/2016 | Herzog | |
| 2017/0189964 A1 | 7/2017 | Backlund et al. | |
| 2018/0015565 A1 | 1/2018 | Goto | |
| 2018/0065179 A1 | 3/2018 | Goto | |

FOREIGN PATENT DOCUMENTS

| | | |
|---|---|---|
| EP | 3 202 513 A1 | 8/2017 |
| EP | 3 223 299 A1 | 9/2017 |
| EP | 2 804 744 B1 | 11/2017 |
| JP | 2003-531034 A | 10/2003 |
| JP | 2007-67192 A | 3/2007 |
| JP | 2015-168877 A | 9/2015 |
| JP | 2015-525428 A | 9/2015 |

OTHER PUBLICATIONS

Written Opinion (WO) dated Jun. 28, 2016 for International Application No. PCT/JP2016/059643.
J-PlatPat English abstract of JP 2007-67192 A.
J-PlatPat English abstract of JP 2015-168877 A.
Supplementary European Search Report (SESR) dated May 18, 2018 mailed in connection with corresponding European Application No. 16 82 5688.1.
English abstract for DE 10 2013 017 792 A1.

* cited by examiner

THREE-DIMENSIONAL LAYER-BY-LAYER SHAPING APPARATUS, THREE-DIMENSIONAL LAYER-BY-LAYER SHAPING APPARATUS CONTROL METHOD, AND THREE-DIMENSIONAL LAYER-BY-LAYER SHAPING APPARATUS CONTROL PROGRAM

RELATED APPLICATION

This application is an application under 35 U.S.C. 371 of International Application No. PCT/JP2016/059643 filed on Mar. 25, 2016, the entire contents of which are incorporated herein by reference.

TECHNICAL FIELD

The present invention relates to a three-dimensional layer-by-layer shaping apparatus, a three-dimensional layer-by-layer shaping apparatus control method, and a three-dimensional layer-by-layer shaping apparatus control program.

BACKGROUND ART

In the above-mentioned technical field, patent literature 1 has disclosed a technique of shutting off an electron beam by a blanking mechanism in a charged particle beam exposure apparatus.

CITATION LIST

Patent Literature

Patent literature 1: Japanese Patent Laid-Open No. 2007-67192

SUMMARY OF THE INVENTION

Technical Problem

Unfortunately, the technique described in the above-mentioned literature loses part of the energy of the electron beam because it is shut off by the blanking mechanism, which part can otherwise be used to maintain the temperature of the shaping plane in a three-dimensional layer-by-layer shaping apparatus.

The present invention enables one to provide a technique of solving the above-described problem.

Solution to Problem

One aspect of the present invention provides a three-dimensional layer-by-layer shaping apparatus comprising:
a material spreader that spreads the material or materials of a three-dimensional layer-by-layer shaped object onto the shaping plane on which the three-dimensional layer-by-layer shaped object is to be shaped;
an electron gun that generates an electron beam;
at least one deflector that deflects the electron beam so that it scans the shaping plane one- or two-dimensionally;
at least one lens that is positioned between the electron gun and the deflector, and focuses the electron beam;
a focus controller that controls the focus of the electron beam based on which region is to be scanned by the electron beam; and
a controller that controls the deflecting direction of the deflector and the scanning rate.

Another aspect of the present invention provides a three-dimensional layer-by-layer shaping apparatus control method comprising:
spreading the material or materials of a three-dimensional layer-by-layer shaped object onto the shaping plane on which the three-dimensional layer-by-layer shaped object is to be shaped;
generating an electron beam;
causing at least one deflector to deflect the electron beam so that it scans the shaping plane one- or two-dimensionally;
causing at least one lens positioned between the electron gun and the deflector to focus the electron beam;
controlling the focus of the electron beam; and
controlling the deflecting direction of the deflector and the scanning rate.

Still another aspect of the present invention provides a three-dimensional layer-by-layer shaping apparatus control program for causing a computer to execute a method comprising:
spreading the material or materials of a three-dimensional layer-by-layer shaped object onto the shaping plane on which the three-dimensional layer-by-layer shaped object is to be shaped;
generating an electron beam;
causing at least one deflector to deflect the electron beam so that it scans the shaping plane one- or two-dimensionally;
causing at least one lens positioned between the electron gun and the deflector to focus the electron beam;
controlling the focus of the electron beam; and
controlling the deflecting direction of the deflector and the scanning rate.

Advantageous Effects of Invention

The present invention can maintain the temperature of the shaping plane without loss of the energy of the electron beam.

DESCRIPTION OF THE EMBODIMENTS

Preferred embodiments of the present invention will now be described in detail with reference to the drawings. It should be noted that the relative arrangement of the components, the numerical expressions, and the numerical values set forth in these embodiments do not limit the scope of the present invention unless stated otherwise specifically.

[First Embodiment]

A three-dimensional layer-by-layer shaping apparatus 100 according to the first embodiment of the present invention will be explained with reference to FIG. 1. The three-dimensional layer-by-layer shaping apparatus 100 is a powder bed type apparatus. The three-dimensional layer-by-layer shaping apparatus 100 first spreads a material (powder) for a three-dimensional layer-by-layer shaped object on its shaping plane by use of a powder spreader (recoater), and then irradiates the material with an electron beam to melt and solidify it, thereby forming one layer of it. Having formed this layer, the three-dimensional layer-by-layer shaping apparatus 100 moves down the shaping table by a height equivalent to the height of this layer, and spreads the material for the next layer with the powder spreader. After spreading the material, the three-dimensional layer-by-layer shaping apparatus 100 again irradiates the material with the electron beam to melt and solidify it, thereby forming another layer. By repeating these operations, the three-dimensional layer-by-layer shaping apparatus 100 shapes a desired three-dimensional layer-by-layer shaped object.

<Technical Premise>

First, the technical premise of this embodiment will be explained. In the technical premise of this embodiment, a common way to change the output power (or current) of the electron beam is by changing voltages, e.g., acceleration voltage, applied to the electron gun for generating the electron beam. After the output power of the electron beam is changed, there is a time lag until the electron beam becomes settled and actually usable in shaping. If the material on the shaping plane is irradiated with the electron beam during this time lag, the material is given excessive heat (energy), and thus the material cannot be given desired heat even if it is irradiated with the electron beam after the electron beam has been settled. This causes a problem that the melting of the material cannot be controlled, and thus the shaping accuracy of the three-dimensional layer-by-layer shaped object decreases.

This problem can be prevented by, for example, providing a conventional mechanism (blanking mechanism) for shutting off the electron beam, in which mechanism the electron beam is directed to and shut off with a beam receiver so that the electron beam does not reach the shaping plane. Here, the electron beam can otherwise be directed to and shut off with an aperture guard or the like.

Shutting off the electron beam with the blanking mechanism, however, results in the beam receiver melting and evaporating because of the energy of the electron beam. The mechanism behind this is similar to that behind the problem that irradiating a small region in the shaping plane with an electron beam having a high energy for a certain period of time results in the material in the region melting and evaporating, which result gives rise to a defective product. The beam receiver melting and evaporating not only is a problem itself but also causes another problem that it contaminates the inside of the electron optics column and, as a consequence, contaminates the three-dimensional layer-by-layer shaped object in process. In addition, since the electron beam shut off does not contribute to the shaping of the object, the energy of the electron beam is wasted.

<Technique of this Embodiment>

Figure 1:
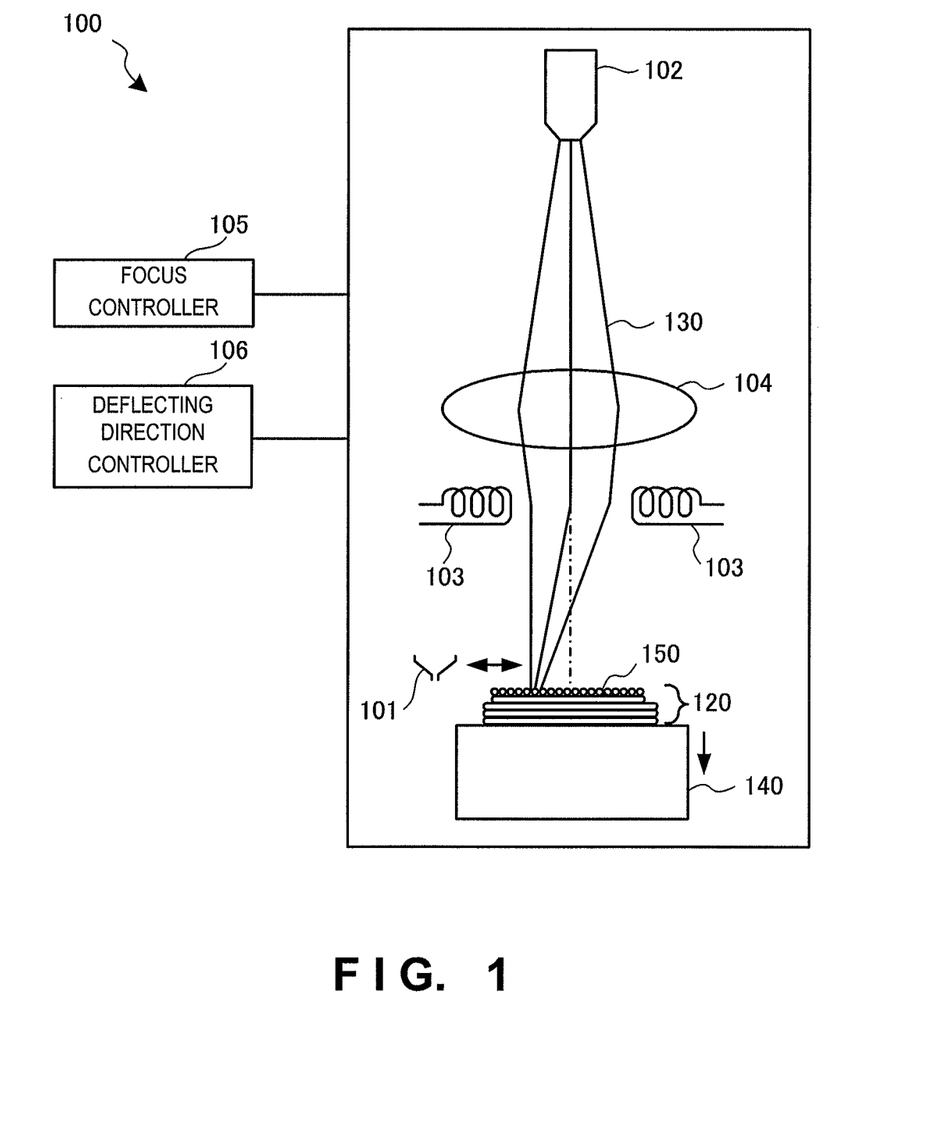
FIG. 1 is view showing the configuration of a three-dimensional layer-by-layer shaping apparatus according to the first embodiment of the present invention.

As shown in FIG. 1, the three-dimensional layer-by-layer shaping apparatus 100 includes a material spreader 101, an electron gun 102, a deflector 103, a lens 104, a focus controller 105, and a deflecting direction controller 106.

The material spreader 101 spreads the material 150 of a three-dimensional layer-by-layer shaped object 120 on the shaping plane (shaping table 140) on which the three-dimensional layer-by-layer shaped object 120 is to be shaped. The material spreader 101 is also called a recoater, and spreads the material 150 densely on the shaping plane while moving above the shaping plane. Note that the material 150 is, but not limited to, metal or resin powder.

After the material 150 is spread on the shaping plane by the material spreader 101, the electron gun 102 generates an electron beam 130. Then, the three-dimensional layer-by-layer shaping apparatus 100 focuses the generated electron beam 130 by the lens 104. Subsequently, the three-dimensional layer-by-layer shaping apparatus 100 deflects the focused electron beam 130 one- or two-dimensionally by using the deflector 103, thereby causing the electron beam 130 to be incident on a desired position of the shaping plane. Then the electron beam 130 melts the material 150 at this desired position. After that, the irradiation with the electron beam 130 is stopped and the material 150 solidifies accordingly. Then, the three-dimensional layer-by-layer shaping apparatus 100 compensates for an increase in the height of the three-dimensional layer-by-layer shaped object 120, which increase is due to the melting and solidification of the material 150, by moving down the shaping stage 140 (Z-axis stage).

The focus controller 105 controls the focus (spot diameter) of the electron beam 130 generated by the electron gun 102. The focus controller 105 controls the focus of the electron beam 130 based on which region is to be scanned by the electron beam 130 on the shaping plane.

For example, when a region where the material 150 is not to be melted (unmelted region) is scanned by the electron beam 130, irradiating this unmelted region with the electron beam 130 with the focus being sharp gives the material 150 in the unmelted region a large amount of heat (energy) per unit area. Consequently, the material 150 in the unmelted region melts although it is not supposed to be melted, and thus the shaping accuracy of the three-dimensional layer-by-layer shaped object 120 decreases. For irradiation of the unmelted region with the electron beam 130, therefore, the focus controller 105 defocuses (blurs) the electron beam 130 so as not to give the material 150 in the unmelted region any excessive heat (energy).

The three-dimensional layer-by-layer shaping apparatus 100 controls melting or unmelting of the material 150 by changing the output power of the electron beam 130 also when the electron beam 130 moves back and forth between an unmelted region and a melted region, where the material 150 is to be melted. Here, the output power of the electron beam 130 can be changed by, for example, changing the current of the electron beam 130 or the acceleration voltage applied to the electron gun 102, but this requires one to wait a certain period of time until the output power (or current) of the electron beam 130 becomes settled. Until the output power of the electron beam 130 becomes settled, the focus controller 105 defocuses of the electron beam 130 so as not to give the material 150 any excessive energy. By thus controlling the focus of the electron beam 130, the three-dimensional layer-by-layer shaping apparatus 100 can decrease the energy given by the electron beam 130 to the material 150, without changing the scanning rate of the electron beam 130.

The deflecting direction controller 106 controls the direction in which the deflector 103 deflects the electron beam 130, that is, the scanning direction of the electron beam 130. The control is in accordance with the type of the material 150 to be melted, the output power of the electron beam 130, and the shaping model of the three-dimensional layer-by-layer shaped object 120, which model is formed by converting the shape of the three-dimensional layer-by-layer shaped object 120 into electronic data. Note that the scanning with the electron beam 130 can be not only linear scanning, but also other types of scanning such as sinusoidal or spiral scanning.

This embodiment does not use a blanking mechanism and ensures that the energy of the electron beam 130 is given to the shaping plane without loss. This is an advantage in maintaining the temperature of the shaping plane, which otherwise cools down with time. By maintaining the temperature of the entire shaping plane, one can suppress thermal stress in it, increasing the ease with which to shape three-dimensional layer-by-layer shaped objects with high shaping accuracy. Furthermore this embodiment, not using a blanking mechanism, allows three-dimensional layer-by-layer shaping apparatuses to have a compact configuration and less chance of being contaminated.

[Second Embodiment]

Figure 2:
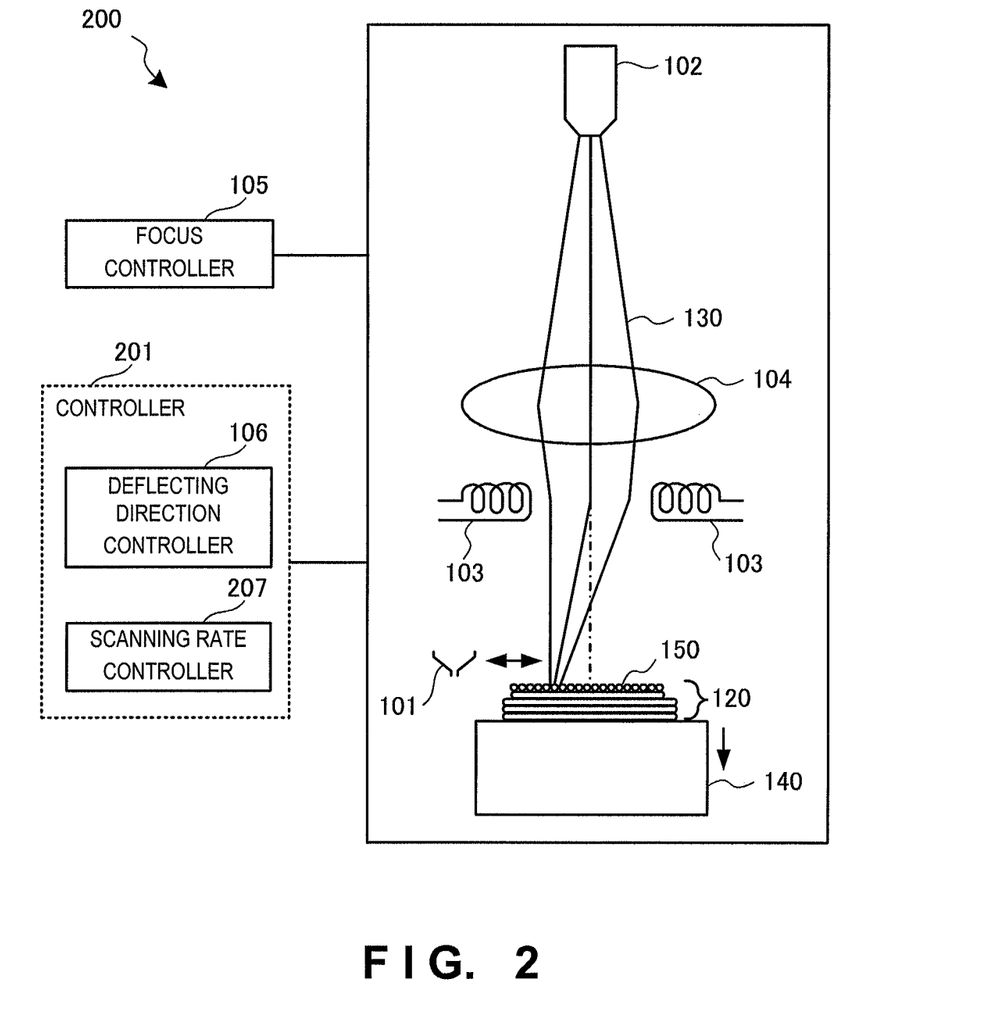
FIG. 2 is view showing the configuration of a three-dimensional layer-by-layer shaping apparatus according to the second embodiment of the present invention.

Next, a three-dimensional layer-by-layer shaping apparatus according to the second embodiment of the present invention will be explained with reference to FIGS. 2 to 5. FIG. 2 is a view explaining the configuration of a three-dimensional layer-by-layer shaping apparatus 200 according to this embodiment. This embodiment differs from the first embodiment in that the three-dimensional layer-by-layer shaping apparatus 200, unlike the three-dimensional layer-by-layer shaping apparatus 100, includes a scanning rate controller. The rest of the configurations and the operations in this embodiment are the same as those in the first embodiment, and thus the same reference numerals denote the same parts and operations, and a detailed explanation thereof will be omitted.

As mentioned above, the three-dimensional layer-by-layer shaping apparatus 200 includes a scanning rate controller 207. The deflecting direction controller 106 and the scanning rate controller 207 form a controller 201.

The scanning rate controller 207 controls the scanning rate of the electron beam 130. For example, in the unmelted regions, the scanning rate controller 207 increases the scanning rate of the electron beam 130 so that the temperature of the material 150 in the unmelted regions does not increase excessively.

In the melted regions, however, the scanning rate controller 207 decreases the scanning rate of the electron beam 130 so that sufficient heat is transferred to the material 150. This is because in the melted regions the temperature of the material 150 must be increased to its melting temperature. By thus controlling the scanning rate of the electron beam 130 in the melted region, the material 150 in the melted regions can be melted, or can otherwise be preliminarily sintered.

In this embodiment, not only the scanning rate, but also, as in the first embodiment, the focus and scanning direction of the electron beam 130 are controlled. This is achieved cooperatively by the focus controller 105 and the controller 201, that is, the deflecting direction controller 106 and the scanning rate controller 207.

For example, when unmelted regions are scanned with the electron beam 130, the heat to be given by the electron beam 130 to them must be decreased so as not to melt the material 150 in them. Here, the heat can also be decreased by decreasing the output power of the electron beam 130. If the output power is decreased (or increased), however, desired heat cannot be given to the material 150 until the output power becomes settled. Therefore, it becomes necessary to prevent the electron beam 130 from giving excessive heat to the material 150.

For this purpose, the focus controller 105 defocuses (blurs) the electron beam 130, and the scanning rate controller 207 controls the scanning rate of the electron beam 130. That is, so that the material 150 in the unmelted regions are not given too large an amount of heat, the electron beam 130 is defocused, and the scanning rate of the electron beam 130 is increased. Here, defocusing the electron beam 130 disperses heat to be given to the material 150, and increasing the scanning rate reduces the time during which the material 150 is exposed to the electron beam 130, which both reduce the heat to be given to the material 150.

If necessary, one can change the focus and scanning rate of the electron beam 130 in accordance with the material 150 to be used and the output power (current) of the electron beam 130, and thereby maintain the temperature of the whole shaping plane (layer-by-layer shaping area), which plane includes both the melted and the unmelted regions.

The three-dimensional layer-by-layer shaping apparatus 200 can use the above focus and scanning rate controls to switch between two modes, that is, preliminary sintering mode and melting mode, for the melted regions on the shaping plane. When the material 150 is to be preliminarily sintered, the focus controller 105 defocuses the electron beam 130, and the scanning rate controller 207 increases the scanning rate of the electron beam 130. When the material 150 is to be melted, the focus controller 105 focuses the electron beam 130 sharply, and the scanning rate controller 207 decreases the scanning rate of the electron beam 130.

The switching between the preliminary sintering and melting modes is more rapid in the above controlling method than in that which controls the output power (current) of the electron beam 130. With the above controlling method, therefore, one can shorten the time taken to shape the three-dimensional layer-by-layer shaped object 120.

The focus and scanning rate controls can also be performed when the output power (current) of the electron beam 130 is changed. Here, these controls can be continued for a period from when the output power of the electron beam 130 is changed to when it becomes settled.

Figure 3:
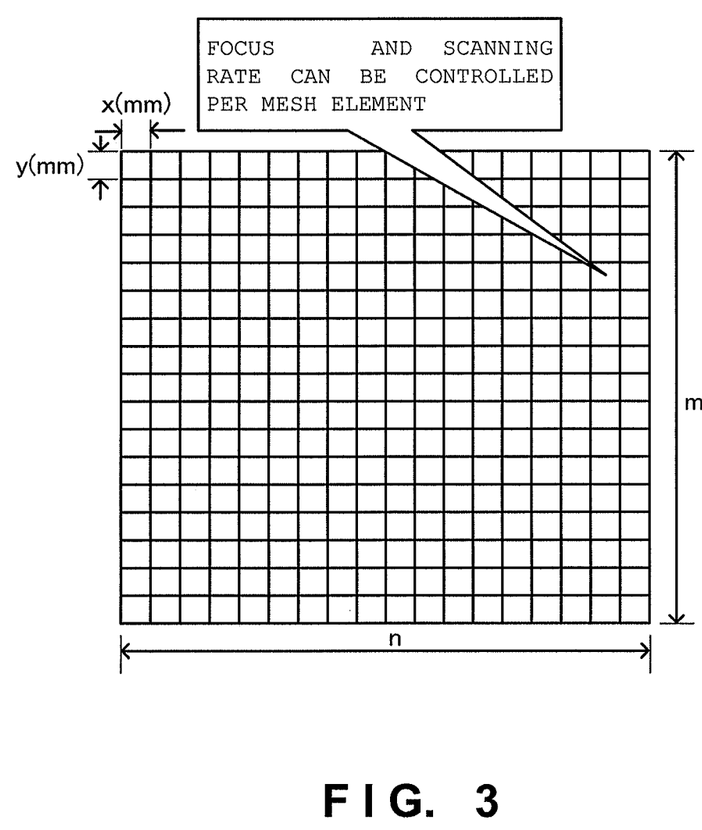
FIG. 3 is a view showing an example of a mesh model of the shaping plane on which a three-dimensional layer-by-layer shaped object is to be shaped by the three-dimensional layer-by-layer shaping apparatus according to the second embodiment of the present invention.
Figure 4:
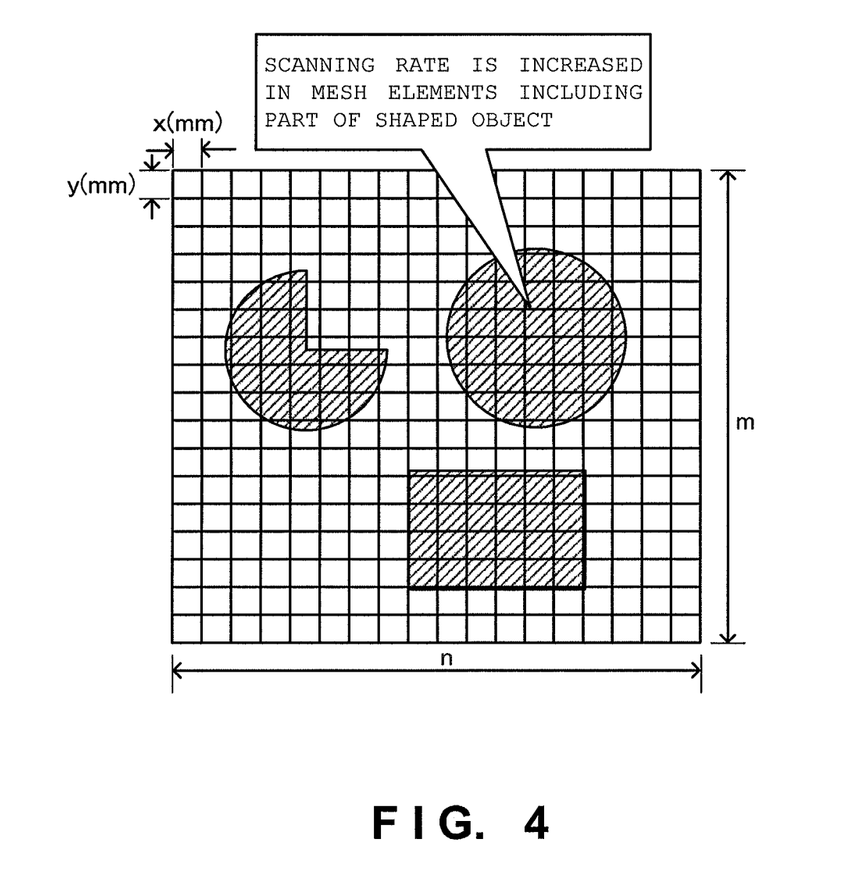
FIG. 4 is a view showing an example of a case in which part of a three-dimensional layer-by-layer shaped object is included in the mesh model of the shaping plane on which the three-dimensional layer-by-layer shaped object is to be shaped by the three-dimensional layer-by-layer shaping apparatus according to the second embodiment of the present invention.

FIG. 3 is a view showing an example of a mesh model of the shaping plane on which a three-dimensional layer-by-layer shaped object is to be shaped by the three-dimensional layer-by-layer shaping apparatus 200 according to this embodiment. FIG. 4 is a view showing an example of a case in which part of a three-dimensional layer-by-layer shaped object is included in the mesh model of the shaping plane on which the three-dimensional layer-by-layer shaped object is to be shaped by the three-dimensional layer-by-layer shaping apparatus 200 according to this embodiment.

The three-dimensional layer-by-layer shaping apparatus 200 determines the defocus amounts and scanning rates by, for example, dividing the shaping plane into n×m square mesh elements which are assigned respective defocus amounts and scanning rates. Here, the respective defocus amounts and scanning rates are determined in consideration, for example, of the presence or absence of part of the three-dimensional layer-by-layer shaped object 120 in respective mesh elements, which part will be included in the shaping plane along with the progress of the shaping. That is, dividing the shaping plane into mesh elements as shown in FIG. 3 enables the three-dimensional layer-by-layer shaping apparatus 200 to control the focus and scanning rate of the electron beam 130 per mesh element. This allows the three-dimensional layer-by-layer shaping apparatus 200 to, when performing preliminary sintering (preheating), keep the surface temperature of the shaping plane even, which can be achieved by decreasing the scanning rate in outer mesh elements and increasing the scanning rate in inner mesh elements.

However, some mesh elements in the shaping plane (upper layer) may have their temperatures increased by the heat in the layer below it (lower layer). More specifically, the mesh elements in the upper layer, together with some mesh elements around them, may have their temperatures increased if the mesh elements are located above part of the three-dimensional layer-by-layer shaped object 120, which part has been melted and solidified in the lower layer. The temperature increase can be compensated for, as is the case with preliminarily sintering, by increasing the scanning rate in the mesh elements in the upper layer. Thus the surface temperature of the shaping plane can be kept even.

Figure 5:
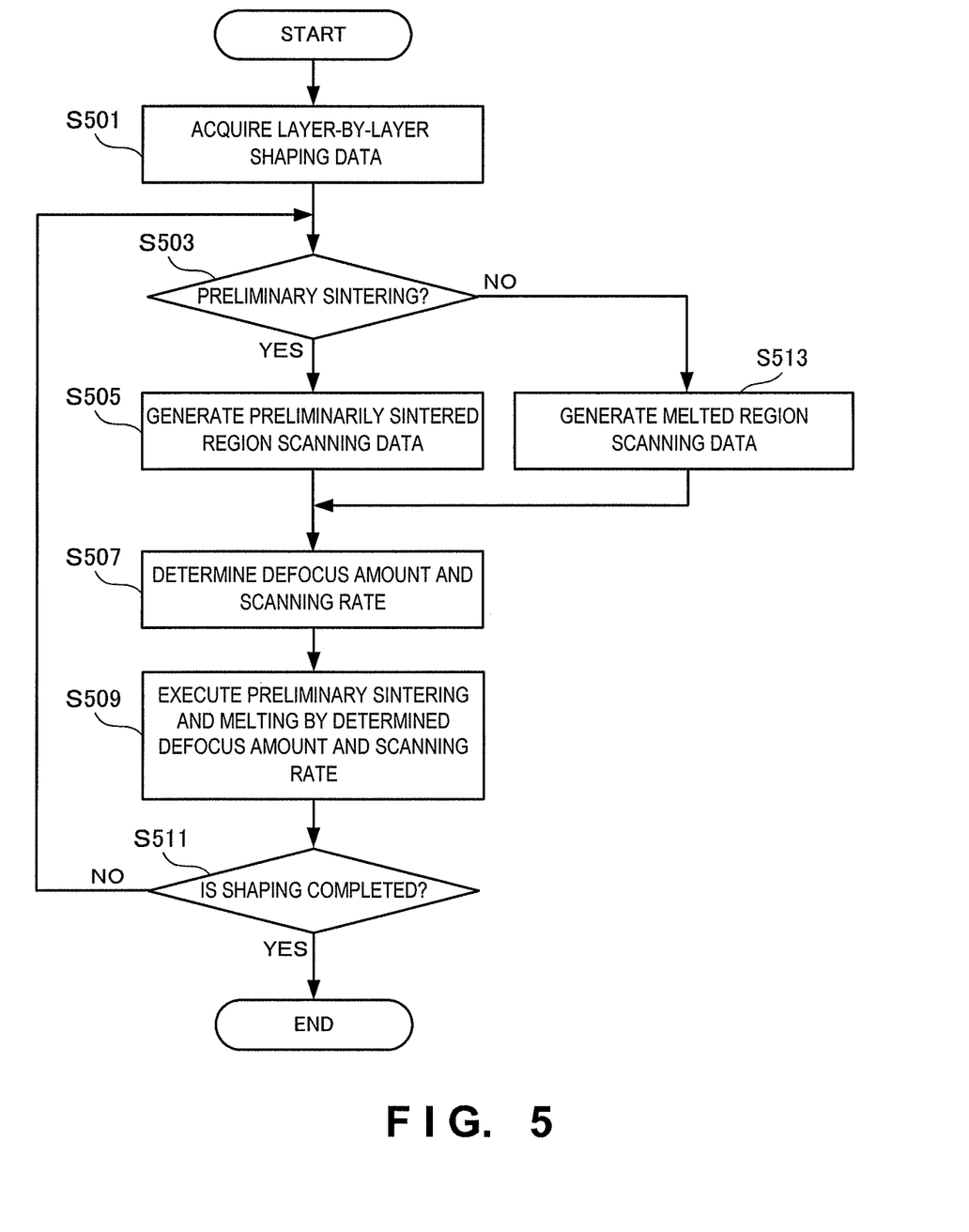
FIG. 5 is a flowchart explaining the procedure of the three-dimensional layer-by-layer shaping apparatus according to the second embodiment of the present invention.

FIG. 5 is a flowchart explaining the procedure of the three-dimensional layer-by-layer shaping apparatus 200 according to this embodiment. In step S501, the three-dimensional layer-by-layer shaping apparatus 200 acquires layer-by-layer shaping data (shaping model) of the three-dimensional layer-by-layer shaped object 120. The data may be input manually by its user, or acquired from CAM (Computer Aided Manufacturing) or CAD (Computer Aided Design).

In step S503, the three-dimensional layer-by-layer shaping apparatus 200 judges whether to execute preliminary sintering. If the judgment is to execute preliminary sintering (YES in step S503), the three-dimensional layer-by-layer shaping apparatus 200 advances to step S505. In step S505, the three-dimensional layer-by-layer shaping apparatus 200 generates the scanning data for scanning a preliminarily sintered region by the electron beam 130.

If the judgment is not to execute preliminary sintering (NO in step S503), the three-dimensional layer-by-layer shaping apparatus 200 advances to step S513. In step S513, the three-dimensional layer-by-layer shaping apparatus 200 generates the scanning data for scanning a melted region by the electron beam 130.

In step S507, the three-dimensional layer-by-layer shaping apparatus 200 judges the defocus amount and scanning rate of the electron beam 130. In step S509, the three-dimensional layer-by-layer shaping apparatus 200 executes preliminary sintering and melting using the determined defocus amount and scanning rate. In step S511, the three-dimensional layer-by-layer shaping apparatus 200 judges whether the shaping of the three-dimensional layer-by-layer shaped object 120 has been completed. If the judgment is that the shaping has been completed (YES in step S511), the three-dimensional layer-by-layer shaping apparatus 200 terminates the process. If the judgment is that the shaping has not been completed (NO in step S511), the three-dimensional layer-by-layer shaping apparatus 200 repeats step S503 and the subsequent steps.

This embodiment controls not only the defocus amount but also the scanning rate of the electron beam. Therefore this embodiment can, without using a blanking mechanism, fine-control the temperature of the shaping plane and thus can, when performing preliminary sintering (preheating), keep the temperature of the shaping plane even.

[Third Embodiment]

Figure 6:
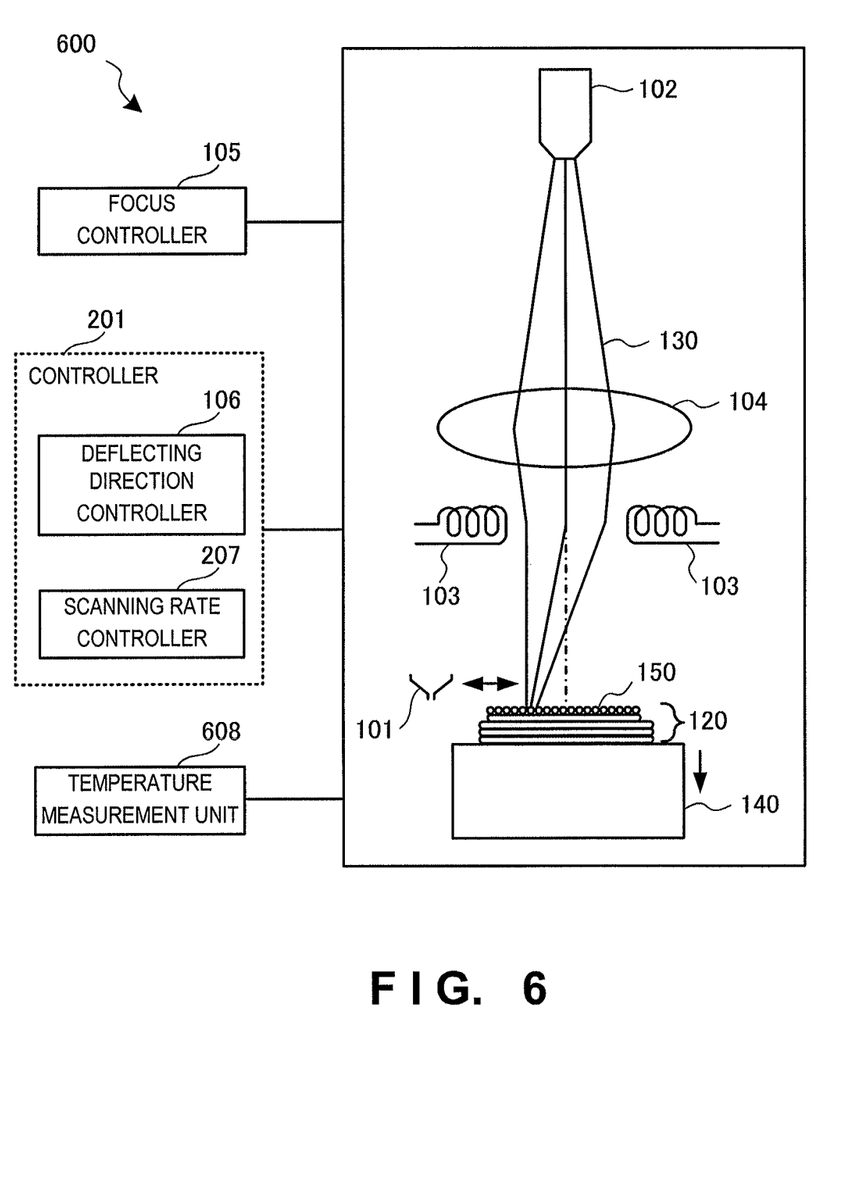
FIG. 6 is a view showing the configuration of a three-dimensional layer-by-layer shaping apparatus according to the third embodiment of the present invention.

A three-dimensional layer-by-layer shaping apparatus 600 according to the third embodiment of the present invention will be explained below with reference to FIG. 6. FIG. 6 is a view explaining the configuration of the three-dimensional layer-by-layer shaping apparatus 600 according to this embodiment. This embodiment differs from the abovementioned second embodiment in that the three-dimensional layer-by-layer shaping apparatus 600, unlike the three-dimensional layer-by-layer shaping apparatus 200, includes a temperature measurement unit. The rest of the configuration and the operation are the same as those of the second embodiment, and thus the same reference numerals denote the same parts and same operations, and a detailed explanation thereof will be omitted.

As mentioned above, the three-dimensional layer-by-layer shaping apparatus 600 includes a temperature measurement unit 608. The temperature measurement unit 608 measures the temperature of the shaping plane, or more precisely the temperature of the material 150 on the shaping plane or of the top of the shaping table 140, and transmits data of the measured temperature to the controller 201. Based on the temperature data received, the controller 201 determines the defocus amount and scanning rate.

The focus and scanning rate controls can be performed in more detail by feedbacking or feedforwarding the temperature data measured by the temperature measurement unit 608 to the controller 201. Examples of the temperature measurement unit 608 include, but are not limited to, a thermography or radiation thermometer.

This embodiment measures the temperature of the shaping plane. By feedbacking or feedforwarding the measured temperature data to the controller, this embodiment can perform more detailed focus and scanning rate controls, and can thus control the temperature of the shaping plane more freely and shape three-dimensional layer-by-layer shaped objects with higher accuracy.

[Other Embodiments]

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present invention is applicable to a system including a plurality of devices or a single apparatus. The present invention is also applicable even when an information processing program for implementing the functions of the embodiments is supplied to the system or apparatus directly or from a remote site. Hence, the present invention also incorporates the program installed in a computer to implement the functions of the present invention by the computer, a medium storing the program, and a WWW (World Wide Web) server that causes a user to download the program. Especially, the present invention incorporates at least a non-transitory computer readable medium storing a program that causes a computer to execute processing steps included in the above-described embodiments.

The invention claimed is:

1. A three-dimensional layer-by-layer shaping apparatus comprising:
   a material spreader that spreads a material or materials of a three-dimensional layer-by-layer shaped object onto a shaping plane on which the three-dimensional layer-by-layer shaped object is to be shaped;
   an electron gun that generates an electron beam;
   at least one deflector that deflects the electron beam so that it scans the shaping plane one- or two-dimensionally;
   at least one lens that is positioned between said electron gun and said deflector, and focuses the electron beam;

a focus controller that controls the focus of the electron beam with the at least one lens based on which region is to be scanned by the electron beam, the focus controller being configured and arranged to defocus the electron beam with the at least one lens when the region to be scanned by the electron beam is an unmelted region, where the material is not to be melted, so as to guard against the material in the unmelted region getting an excessive unit-area heat that decreases a shaping accuracy of the three-dimensional layer-by-layer shaped object;

wherein the focus controller is configured to control the focus of the electron beam in response to a change in output power of the electron beam so as to prevent the material in the unmelted region from getting the excessive unit-area heat until the change in output power is settled; and a controller that controls the deflecting direction of said deflector and a scanning rate.

2. The three-dimensional layer-by-layer shaping apparatus according to claim 1, wherein said focus controller defocuses the electron beam when the region to be scanned by the electron beam is to be preliminarily sintered.

3. The three-dimensional layer-by-layer shaping apparatus according to claim 1, wherein said controller makes the scanning rate for the unmelted region higher than that for the melted region, where the material is to be melted.

4. The three-dimensional layer-by-layer shaping apparatus according to claim 1, wherein said focus controller defocuses the electron beam when the output power of the electron beam is changed.

5. The three-dimensional layer-by-layer shaping apparatus according to claim 1, further comprising a temperature measurement unit for the shaping plane, wherein said focus controller controls the focus based on the temperature of the shaping plane, and said controller controls the deflecting direction of said deflector and the scanning rate based on the temperature of the shaping plane.

6. The three-dimensional layer-by-layer shaping apparatus according to claim 1, wherein said controller divides the shaping plane into mesh elements, and controls the scanning rate per mesh element.

7. A three-dimensional layer-by-layer shaping apparatus control method comprising:

providing the three-dimensional layer-by-layer shaping apparatus according to claim 1, spreading with the material spreader a material or materials of a three-dimensional layer-by-layer shaped object onto a shaping plane on which the three-dimensional layer-by-layer shaped object is to be shaped;

generating an electron beam with the electron gun;

causing the at least one deflector to deflect the electron beam so that it scans the shaping plane one- or two-dimensionally;

causing the at least one lens positioned between the electron gun and the deflector to focus the electron beam;

controlling the focus of the electron beam with the focus controller by causing the at least one lens to defocus the electron beam in a region to be scanned by the electron beam that is an unmelted region, where the material is not to be melted, so as not to give the material in the unmelted region an excessive unit-area heat that can decrease a shaping accuracy of the three-dimensional layer-by-layer shaped object;

wherein said controlling step includes controlling the focus of the electron beam in response to a change in output power of the electron beam so as to prevent the material in the unmelted region from getting the excessive unit-area heat until the change in output power is settled; and controlling the deflecting direction of the deflector and the scanning rate.

8. A non-transitory computer readable medium storing a three-dimensional layer-by-layer shaping apparatus control program for the three-dimensional layer-by-layer shaping apparatus according to claim 1, the control program causing a computer to execute a method comprising:

spreading with the material spreader a material or materials of a three-dimensional layer-by-layer shaped object onto a shaping plane on which the three-dimensional layer-by-layer shaped object is to be shaped;

generating with the electron gun an electron beam;

causing the at least one deflector to deflect the electron beam so that it scans the shaping plane one- or two-dimensionally;

causing the at least one lens positioned between the electron gun and the deflector to focus the electron beam;

controlling the focus of the electron beam with the focus controller by causing the at least one lens to defocus the electron beam in a region to be scanned by the electron beam that is an unmelted region, where the material is not to be melted, so as not to give the material in the unmelted region an excessive unit-area heat that can decrease a shaping accuracy of the three-dimensional layer-by-layer shaped object;

wherein said controlling step includes controlling the focus of the electron beam in response to a change in output power of the electron beam so as to prevent the material in the unmelted region from getting the excessive unit-area heat until the change in output power is settled; and controlling the deflecting direction of the deflector and the scanning rate.

* * * * *